(12) United States Patent
Tanaka et al.

(10) Patent No.: US 7,366,221 B2
(45) Date of Patent: Apr. 29, 2008

(54) LASER APPARATUS AND METHOD OF DRIVING DIFFRACTION GRATING

(75) Inventors: Tomiji Tanaka, Saitama (JP); Hiroyuki Yamagata, Kanagawa (JP); Masaki Chiba, Chiba (JP)

(73) Assignee: Sony Corporation, Tokyo (JP)

( * ) Notice: Subject to any disclaimer, the term of this patent is extended or adjusted under 35 U.S.C. 154(b) by 69 days.

(21) Appl. No.: 11/383,854

(22) Filed: May 17, 2006

(65) Prior Publication Data
US 2006/0274811 A1 Dec. 7, 2006

(30) Foreign Application Priority Data
May 20, 2005 (JP) .......................... P2005-147765

(51) Int. Cl.
*H01S 3/08* (2006.01)
(52) U.S. Cl. .................... 372/102; 372/15; 372/20; 372/98
(58) Field of Classification Search .............. 372/102, 372/20, 15
See application file for complete search history.

(56) References Cited

U.S. PATENT DOCUMENTS 5,982,794 A * 11/1999 Tamura ................. 372/29.012
2006/0227821 A1 * 10/2006 Klooster ...................... 372/20

* cited by examiner

*Primary Examiner*—Dung (Michael) T. Nguyen
(74) *Attorney, Agent, or Firm*—Sonnenschein Nath & Rosenthal LLP

(57) ABSTRACT

A laser apparatus is disclosed. The laser apparatus has a diffraction grating that receives laser light from a semiconductor laser, emits first order diffracted light having a predetermined wavelength to the semiconductor laser, and reflects zero-th order light, a reflection section that reflects the zero-th order light reflected by the diffraction grating, a hold section that holds the diffraction grating and the reflection section while an open angle of the diffraction grating and the reflection section is kept constant, the hold section being rotatable with a fulcrum of an intersection of an extended line of a front surface of the diffraction grating and an extended line of a front surface of the reflection section, and a linear drive section that rotates the hold section with a linear motion of a piezoelectric device that expands and shrinks by the piezoelectric effect.

2 Claims, 17 Drawing Sheets

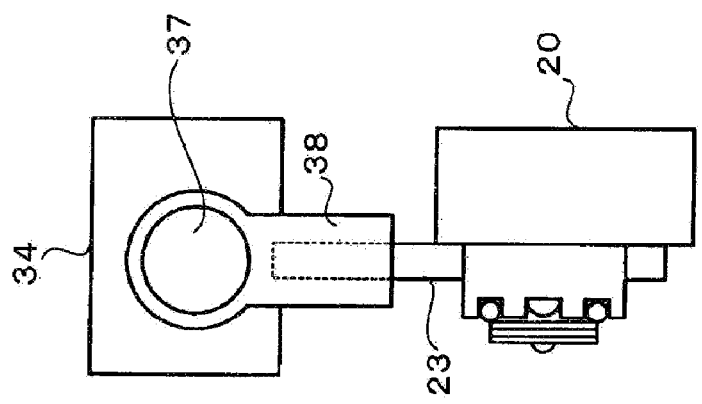
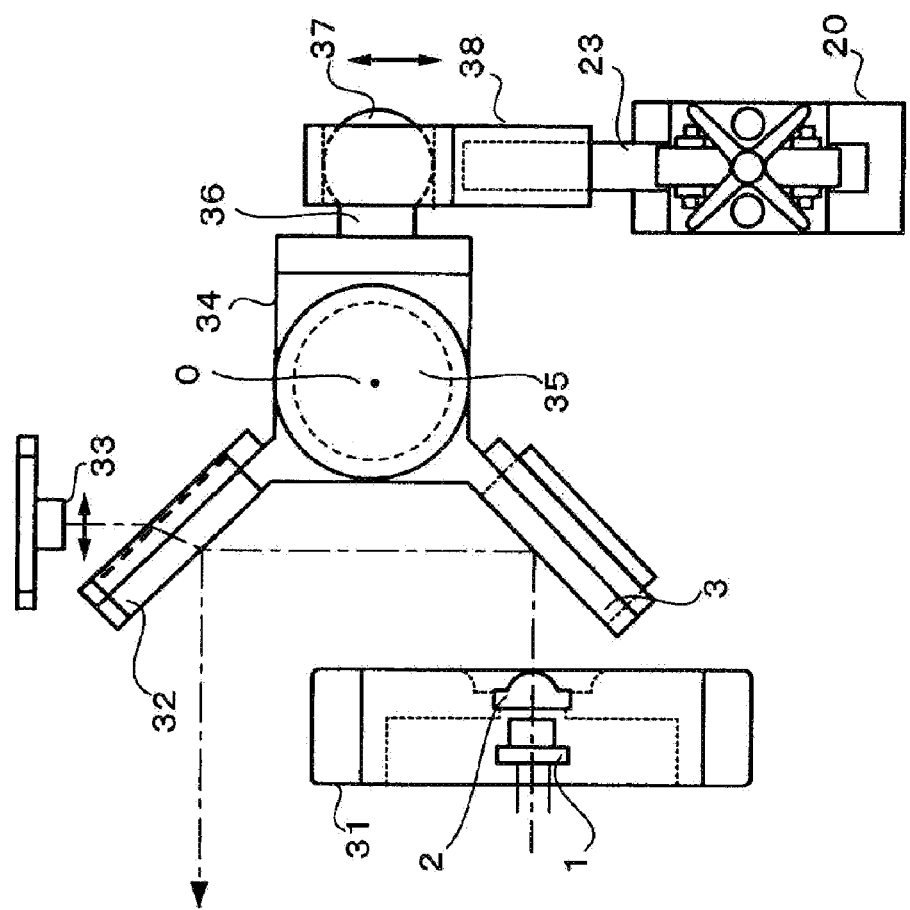

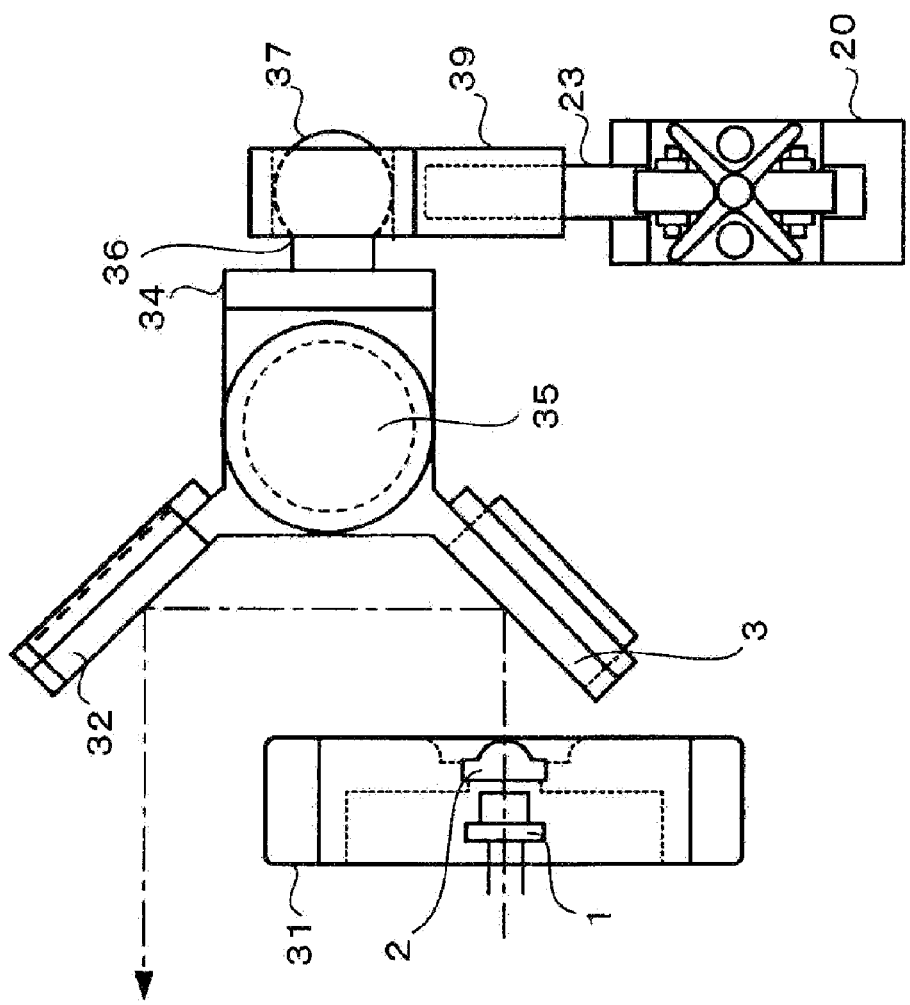

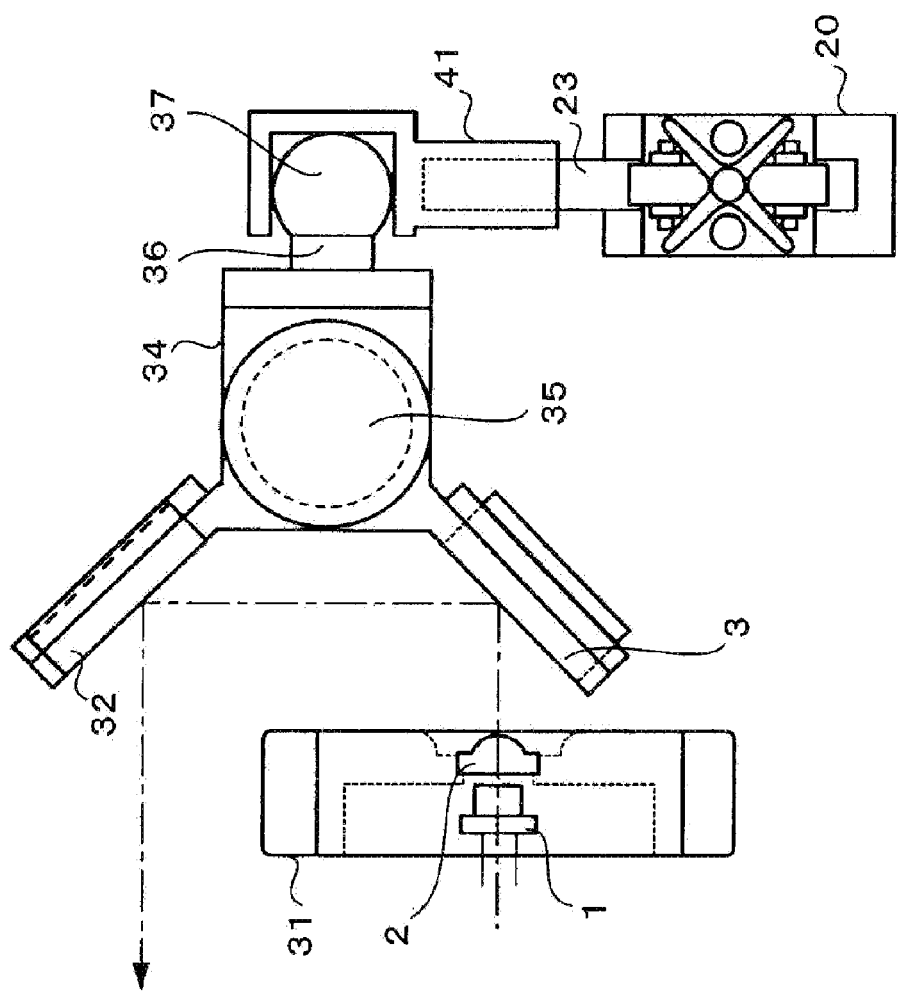
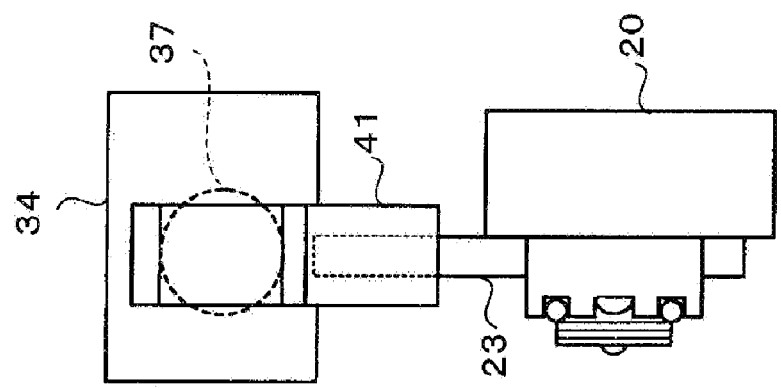

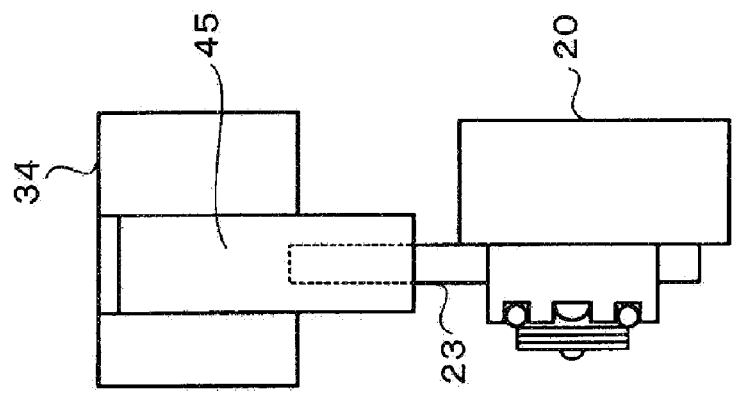
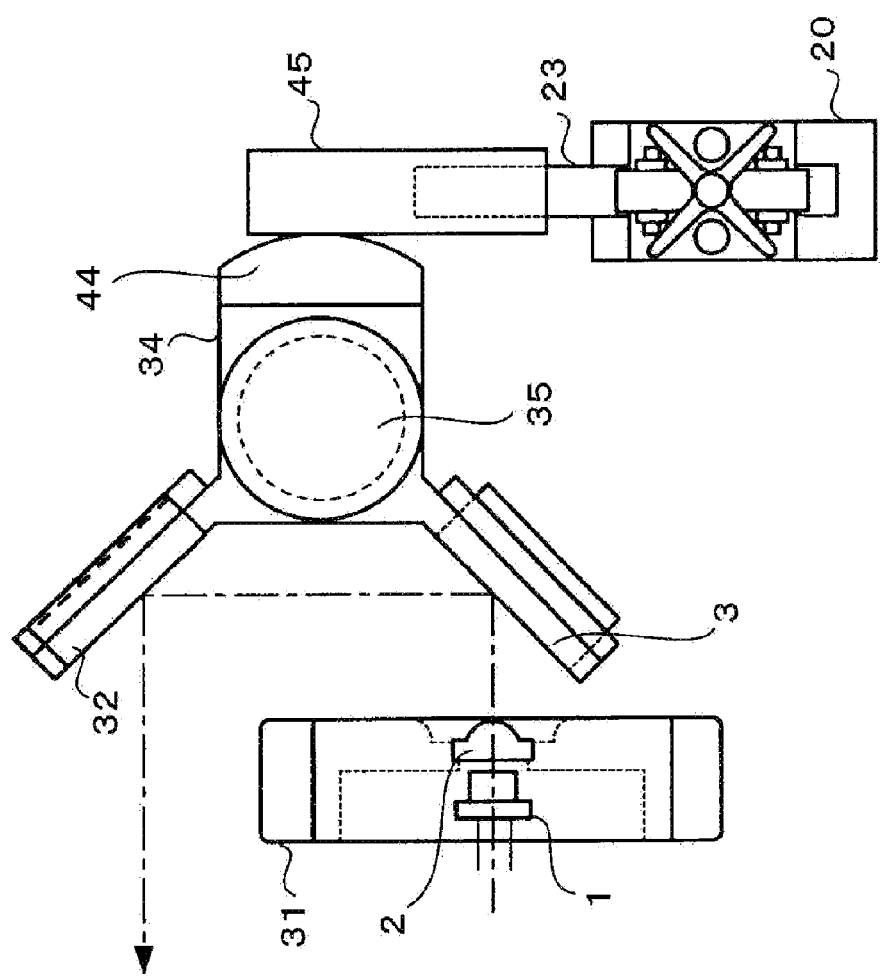

LASER APPARATUS AND METHOD OF DRIVING DIFFRACTION GRATING

CROSS REFERENCES TO RELATED APPLICATIONS

The present invention contains subject matter related to Japanese Patent Application No. 2005-147765 filed in the Japanese Patent Office on May 20, 2005, the entire contents of which being incorporated herein by reference.

BACKGROUND OF THE INVENTION

1. Field of the Invention

The present invention relates to a laser apparatus and a method of driving a diffraction grating.

2. Description of the Related Art

Since a laser apparatus has features of small size, low power consumption, and so forth, it has been widely used for information devices in recent years. For example, in a holographic data storage (HDS), data are recorded using interference of two beams that are split from one beam by a beam splitter and combined again on a disc.

As a light source for holographic record and reproduction, a single mode laser light source is used. For example, a gas laser or a second harmonic generation (SHG) laser is used. Instead, an external cavity type semiconductor type laser using a laser diode (LD) can be used.

A regular laser diode emits multi mode light. Thus, it does not provide sufficient coherency. However, when the laser diode is structured as an external cavity type, it emits single mode light. As a result, a light source for a hologram record and reproduction having high coherency can be accomplished. A typical structure of the laser apparatus having an external cavity type semiconductor laser is described in the following non-patent document.

[Non-Patent Document 1]

L. Ricci, et al. "A compact grating-stabilized diode laser system for atomic physics," Optics Communications, 117 1995, pp 541-549

FIG. 1 shows a structure of an external cavity type semiconductor laser called Littrow type using a laser diode. Laser light emitted from a laser diode 1 is collimated by a collimator lens 2. The collimated light enters a reflection type diffraction grating (hereinafter referred to as the grating) 3.

The grating 3 is mounted on a grating mounting section 4. The grating mounting section 4 is held on a stay 6 through a leaf spring 5. One end portion and another end portion on one side of the grating mounting section 4 are secured to the leaf spring 5 and a screw 7, respectively. By turning the screw 7, the other end portion secured thereto is moved in the upper and lower directions. As a result, the angle of the grating 3 is varied. The screw 7 is inserted into a screw support (not shown).

When the laser light is reflected by the grating 3, the laser light is split into zero-th order light L0 and first order lights L1a, L1b, and L1c. The reflection angles of the first order lights vary corresponding to the wavelengths thereof. The first order lights L1a, L1b, and L1c have different wavelengths.

The first order light L1a having a wavelength corresponding to the angle of the grating 3 is retro-injected into the laser diode 1 through the collimator lens 2. As a result, the wavelength of the first order light L1a retro-injected into the laser diode 1 becomes dominant. Thus, the laser diode 1 emits single mode light. The emitted single mode light has a wavelength that is the same as that of light returned from the grating 3. In other words, the first order light L1a causes the grating 3 and the laser diode 1 to form a cavity therebetween. The laser diode 1 oscillates with a wavelength that depends on the shape of the grating 3 and the distance between the grating 3 and the laser diode 1. The grating 3 reflects the zero-th order light L0 and emits it to the outside like a mirror. The zero-th order light L0 is used to hologram record and reproduce data.

In the external cavity type laser apparatus, there are an external cavity mode hop region and a laser chip mode hop region. In the external cavity mode hop region, as the laser power increases, the wavelength of laser light gradually increases. In the laser chip mode hop region, as the laser power increases, the wavelength of emitted laser light sharply decreases. The wavelength of the laser light discretely shifts as the laser power increases.

As the relationship between the laser power and wavelength of laser light outputted from the laser apparatus, assuming that the laser power and the wavelength are plotted on the horizontal axis and vertical axis, respectively, on a graph, as the laser power of the laser light increases, the wavelength of the laser light varies in a saw wave shape. The wavelength of the laser diode varies for around 0.04 nm in mode hops of the laser diode in the relationship between the power and wavelength. As shown in FIG. 2, with a predetermined laser power, laser light having only a predetermined wavelength can be generated. In the example shown in FIG. 2, laser light having a wavelength (407.89 nm) is denoted.

As shown in FIG. 3, in a tunable laser apparatus, by changing the angle of the grating 3, the wavelength is varied by for example ±2 nm to the center wavelength for example 403.5 nm. As will be described later, (A−B)/(A+B) denotes a calculated result of signals A and B of which the position of a spot that varies corresponding to the wavelength of the laser light is detected by a two-divided detector.

For example, the tunable laser apparatus is set so that the calculated output becomes 0 at the center wavelength. When data are recorded on a hologram medium by the wavelength multiplexing method, it is necessary to satisfy a condition of which the wavelength variation step is around 100 pm. This wavelength variation step corresponds to a rotation angle variation step of 0.015° in the grating 3.

However, when the angle of the grating 3 is changed, the direction of the zero-th order light L0 that is emitted varies. Thus, in this case, the laser apparatus may not be used as a light source. The following non-patent document 2 describes a structure of a mirror set that allows exit light to take the same optical path as incident light even if the angle of the grating 3 is changed.

[Non-Patent Document 2]

T. M. Hard, "Laser Wavelength Selection and Output Coupling by a Grating," APPLIED OPTICS, Vol. 9, No. 8, August 1970, pp 1825-1830

FIG. 4 shows a laser apparatus having a structure of a mirror set. A grating 3 and a mirror 8 are countered with an open angle of for example 90°. Laser light emitted from a laser diode 1 is reflected by the grating 3. In addition, the reflected light is reflected by the mirror 8 and then exited to the outside. The grating 3 and the mirror 8 are rotated around a rotation axis 9 while the open angle is kept. The rotation axis 9 is disposed on the other end of the grating 3. The rotation axis 9 is perpendicular to the optical axis of the laser light emitted form the laser diode 1. In addition, the rotation axis 9 extends along grooves of the grating 3.

The exit direction of the zero-th order light L0 in the case that the grating 3 and the mirror 8 are positioned as denoted by solid arrow lines is different from that in the case that they are positioned as denoted by dotted arrow lines. When the exit direction of the zero-th order light L0 of the laser apparatus varies, it is not suitable to use the laser apparatus as a light source.

When the grating 3 and the mirror 8 in the structure described in the foregoing non-patent document 2 is rotated, the direction of the laser light that is emitted does not vary. Next, with reference to FIG. 5, this theory will be described. One end of the grating 3 and one end of the mirror 8 are connected at an intersection of an extended line of a reflection surface of the grating 3 and an extended line of a reflection surface of the mirror 8 by a rotation axis 11 in parallel with an extended direction of grooves of the grating 3. The rotation axis 11 is the center of a circle 12. The angle of the reflection surface of the grating 3 and the reflection surface of the mirror 8 is denoted by V.

When predetermined incident light 13 is given from point c to point d, the incident light 13 enters the grating 3 at point d. Zero-th order light 14 is reflected at the same angle as the incident angle. The reflected light travels to point e. At point e, the mirror 8 receives the zero-th order light 14 and emits reflected light 15 to point f. An extended line of the incident light 13 and an extended line of the reflected light 15 are intersected at point j. The extended lines and the line of the incident light 13 are tangents of the circle 12.

When the grating 3 and the mirror 8 are rotated around the rotation axis 11 while the angle V is kept, the grating 3 and the mirror 8 are moved to positions denoted by dotted lines. At this point, the predetermined incident light 13 extends from point c to point g. At point g, the incident light 13 enters the grating 3. The grating 3 emits zero-th order light 16. The zero-th order light 16 extends from point g to point h. At point h, the zero-th order light 16 is reflected by the mirror 8. The reflected light 15 extends from point h to point f.

After the grating 3 and the mirror 8 are rotated, the extended line of the incident light 13, the extended line of the reflected light 15, and the line of the zero-th order light 16 are tangents of the circle 12. Thus, when the grating 3 and the mirror 8 are rotated with a fulcrum of the intersection of the extended lines of the reflection surfaces, it is clear that the angle of the predetermined incident light 13 and the reflected light 15 is kept as a constant value W.

When this theory is applied, even if the inclination of the grating 3 is changed to vary the wavelength of laser light, the output laser light can be exited to a predetermined position. As a result, a tunable laser can be accomplished.

The rotation angle at which the grating 3 and the mirror 8 having the structure of the mirror set are rotated while the opposite angle is kept is as small as 0.0150 per step. As a device that accomplishes a fine rotation angle, a stepping motor is known.

SUMMARY OF THE INVENTION

However, the angle step of a stepping motor is around 1.8° that is much larger than 0.015°. When gears are combined, they accomplish a small angle step. Since the gear ratio becomes large, it is necessary to use two or more gears. As a result, a motor section that contains a gear mechanism becomes large. Thus, the laser apparatus becomes large. In addition, when the gear mechanism is used, the accuracy of the laser apparatus deteriorates. Moreover, when the angle between the grating 3 and the mirror 8 is kept constant, it is necessary to supply a current to the stepping motor regardless whether it operates. Thus, the power consumption of the laser apparatus increases. In other words, the stepping motor has many drawbacks as a drive source that changes the inclination of the grating.

In view of the foregoing, it would be desirable to provide a laser apparatus and a method of driving a grating that allow problems that result from such a stepping motor to be solved.

According to an embodiment of the present invention, there is provided a laser apparatus that has a diffraction grating that receives laser light from a semiconductor laser, emits first order diffracted light having a predetermined wavelength to the semiconductor laser, and reflects zero-th order light, a reflection section that reflects the zero-th order light reflected by the diffraction grating, a hold section that holds the diffraction grating and the reflection section while an open angle of the diffraction grating and the reflection section is kept constant, the hold section being rotatable with a fulcrum of an intersection of an extended line of a front surface of the diffraction grating and an extended line of a front surface of the reflection section, and a linear drive section that rotates the hold section with a linear motion of a piezoelectric device that expands and shrinks by the piezoelectric effect.

According to an embodiment of the present invention, there is provided a drive method of varying an angle of a diffraction grating of a laser apparatus having a diffraction grating that receives laser light from a semiconductor laser, emits first order diffracted light having a predetermined wavelength to the semiconductor laser, and reflects zero-th order light, a reflection section that reflects the zero-th order light reflected by the diffraction grating, a hold section that holds the diffraction grating and the reflection section while an open angle of the diffraction grating and the reflection section is kept constant, the hold section being rotatable with a fulcrum of an intersection of an extended line of a front surface of the diffraction grating and an extended line of a front surface of the reflection section, and a linear drive section that rotates the hold section with a linear motion of a piezoelectric device that expands and shrinks by the piezoelectric effect. It is determined whether the wavelength detected by the detection section matches a designated wavelength. The linear drive section is stopped when the determined result denotes that the detected wavelength matches the designated wavelength. The linear drive section is driven so that the detected wavelength becomes close to the designated wavelength when the determined result denotes that the detected wavelength does not match the designated wavelength.

According to an embodiment of the present invention, since a linear drive section that operates according to the piezoelectric effect is used, a grating and a reflection section can be rotated at a very small step in comparison with a structure that uses a stepping motor of the related art. Thus, the wavelength of the laser apparatus can be varied at a fine step necessary for a hologram device and so forth.

These and other objects, features and advantages of the present invention will become more apparent in light of the following detailed description of a best mode embodiment thereof, as illustrated in the accompanying drawings.

BRIEF DESCRIPTION OF THE DRAWINGS

The invention will become more fully understood from the following detailed description, taken in conjunction with the accompanying drawings, wherein similar reference numerals denote similar elements, in which:

FIG. 8A and FIG. 8B are a plan view and a side view of a first embodiment of the present invention, respectively;

FIG. 12A and FIG. 12B are a plan view and a side view of a second embodiment of the present invention, respectively;

FIG. 14A and FIG. 14B are a plan view and a side view of a fourth embodiment of the present invention, respectively;

FIG. 17A and FIG. 17B are a plan view and a side view of a sixth embodiment of the present invention, respectively;

DETAILED DESCRIPTION OF THE PREFERRED EMBODIMENTS

Next, with reference to the accompanying drawings, embodiments of the present invention will be described. According to an embodiment of the present invention, a linear motor is used, which produces a linear force along its length as a linear drive source which changes the inclination of a grating using expansion and shrinkage of a piezoelectric device as the piezoelectric effect. An example of this type of linear motor is Piezo Legs Motor made by Piezo Motor Company. The piezo legs motor uses a bimorph of which two piezoelectric devices are adhered.

Figure 6A:
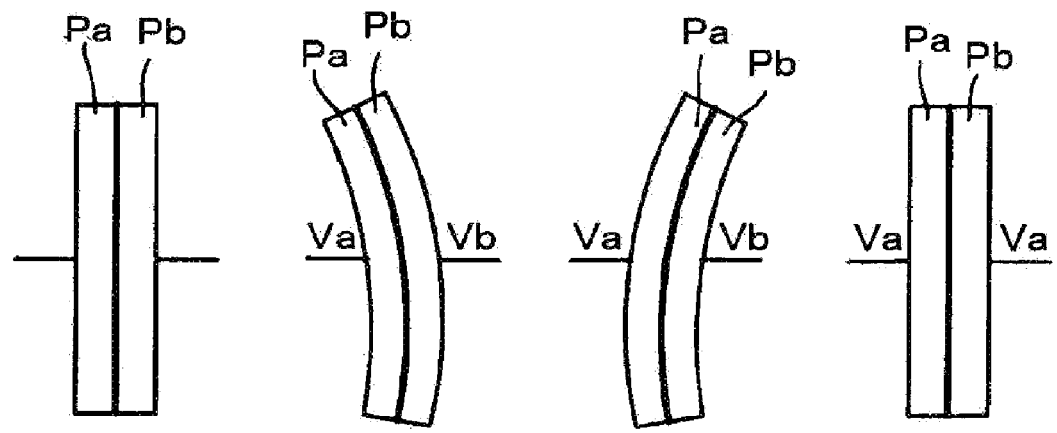
FIG. 6A and FIG. 6B are schematic diagrams describing a theory of operation of a piezo legs motor, respectively.

FIG. 6A describes a bimorph of which planar piezoelectric devices Pa and Pb are polarized in the direction of their thicknesses. The piezoelectric devices Pa and Pb are adhered with a common electrode therebetween. Electrodes are disposed in the piezoelectric devices Pa and Pb. A voltage applied to the piezoelectric device Pa is denoted by Va, whereas a voltage applied to the piezoelectric device Pb is denoted by Vb. The voltages Va and Vb cause an electric field to be applied in parallel with the polarized directions and thereby crystals of the piezoelectric devices Pa and Pb to expand and shrink as the piezoelectric effect.

FIG. 6A also shows states of the bimorph corresponding to voltages applied to the piezoelectric devices Pa and Pb. The leftmost state of the bimorph in the drawing denotes that no voltages are applied to the piezoelectric devices Pa and Pb. In this state, the bimorph does not bend. When the voltages Va and Vb (where Va<Vb) are applied to the bimorph, the bimorph bends. When the voltages Va and Vb (where Va>Vb) are applied to the bimorph, it reversely bends as the third state of the bimorph shown in FIG. 6A. When the voltages Va and Vb (where Va=Vb) are applied to the bimorph, it does not bend as the rightmost state of the bimorph shown in FIG. 6A. FIG. 6A shows an example of states of the bimorph. When the polarized directions of the piezoelectric devices Pa and Pb are reversed and the same voltages are applied thereto, the bimorph bends.

Figure 6B:
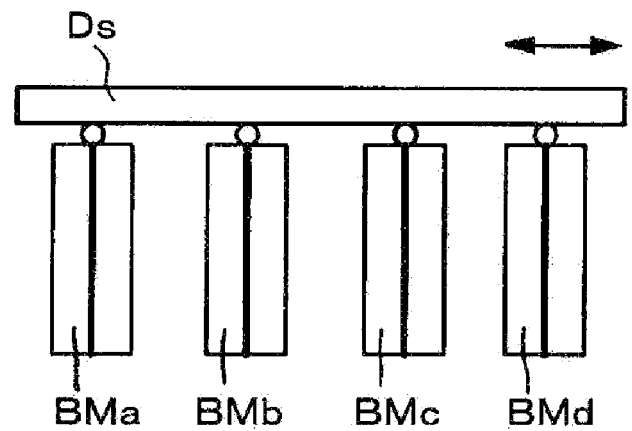

FIG. 6B shows a conceptual structure of the piezo legs motor. For example, four legs made of rod shaped bimorphs BMa, BMb, BMc, and BMd are aligned and their first edges are contacted to a drive rod Ds. A pair of the legs BMa and BMc and a pair of the legs BMb and BMd are synchronously driven. As shown in FIG. 6A, the four legs bend leftward and rightward corresponding to an applied voltage. In addition, the four legs expand and shrink upward and downward. Although detailed description of their operation is omitted, when the bending and expanding/shrinking operations of each pair of the legs BMa, BMb, BMc, and BMd are controlled in a predetermined sequence, the drive rod Ds at the edges of the four legs is linearly moved in the arrow directions.

Figure 7A:
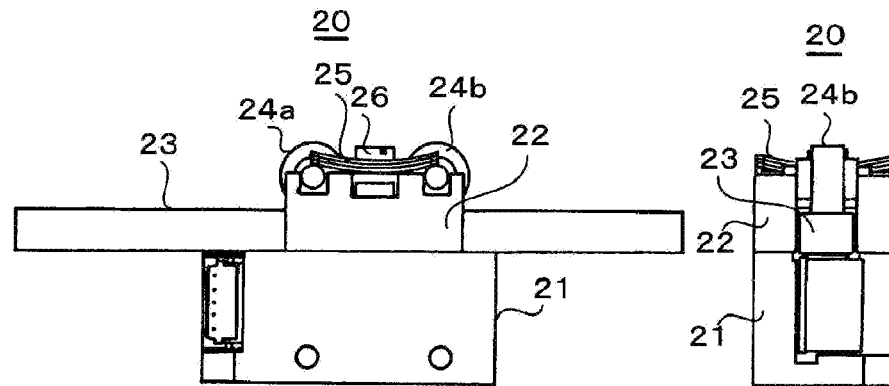
FIG. 7A, FIG. 7B, FIG. 7C, and FIG. 7D are a front view, a plan view, a side view, and a perspective view of the piezo legs motor, respectively.
Figure 7C:
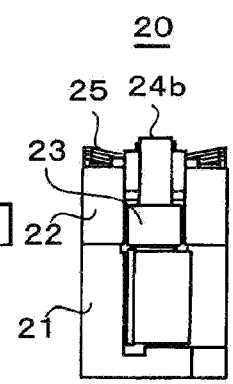
Figure 7B:
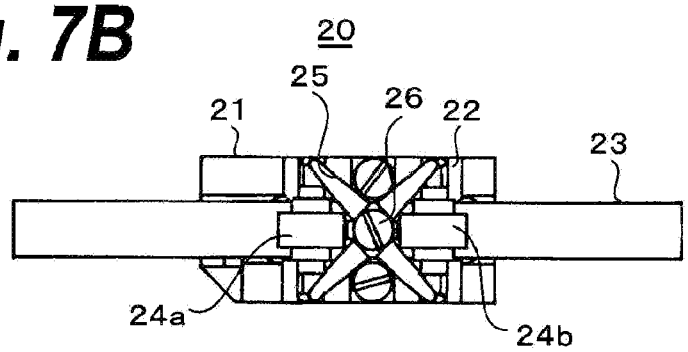
Figure 7D:
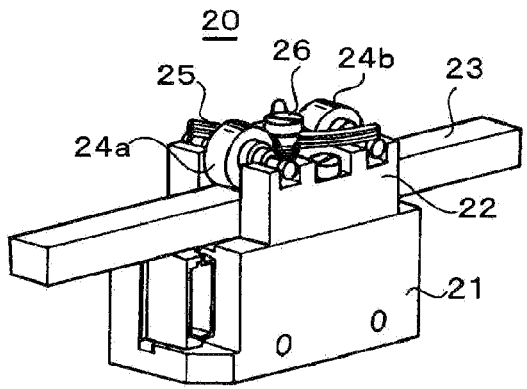

In FIG. 7A, FIG. 7B, FIG. 7C, and FIG. 7D, reference numeral 20 denotes a real piezo legs motor according to embodiments of the present invention. FIG. 7A is a front view of the piezo legs motor, FIG. 7B is a plan view thereof, FIG. 7C is a side view thereof, and FIG. 7D is a perspective view thereof. Four legs made of rod shaped bimorphs described in FIG. 6B are disposed in a box-shaped case 21. A bearing holder 22 is disposed above the case 21.

A drive rod 23 formed in for example a square prism shape and made of alumina is slidably inserted into a space formed between members disposed in parallel with both sides of the bearing holder 22. The drive rod 23 is contactable to the edges of the bimorphs on the upper surface of the case 21. A pair of bearing rollers 24a and 24b are rotatably supported by the bearing holder 22 so that the bearing rollers 24a and 24b contact the drive rod 23 that pierces the bearing holder 22.

Rotation shafts of the bearing rollers 24a and 24b are supported on the members disposed in parallel with both the sides of the bearing holder 22. In addition, the rotation shafts of the bearing rollers 24a and 24b are pressed by a cross-shaped tension spring 25. A center portion of the tension spring 25 is secured to the bearing holder 22 with a screw 26. The bearing rollers 24a and 24b rotatably supported contact the drive rod 23 so that the drive rod 23 smoothly slides.

FIG. 8A and FIG. 8B show a first embodiment of the present invention, the first embodiment using the foregoing piezo legs motor 20. A laser diode 1 is airtightly contained in a holder 31. Laser light is emitted from the laser diode 1 through a collimate lens 2 mounted on the holder 31. The laser light enters a grating 3. The collimate lens 2 also functions as window glass with which the laser diode 1 is airtightly contained in the holder 31.

A semi-transmissive mirror 32 is disposed as a member of a mirror set with an opposite angle of for example 90° to the grating 3. In this specification, "semi-transmissive" of the semi-transmissive mirror does not mean 50% of transmissivity. Instead, "semi-transmissive" mirror means a mirror that transmits a small amount of light whose transmissivity is 10% or less, for example 5%. Laser light transmitted through the semi-transmissive mirror 32 enters a light reception surface of a two-divided detector 33.

Figure 1:
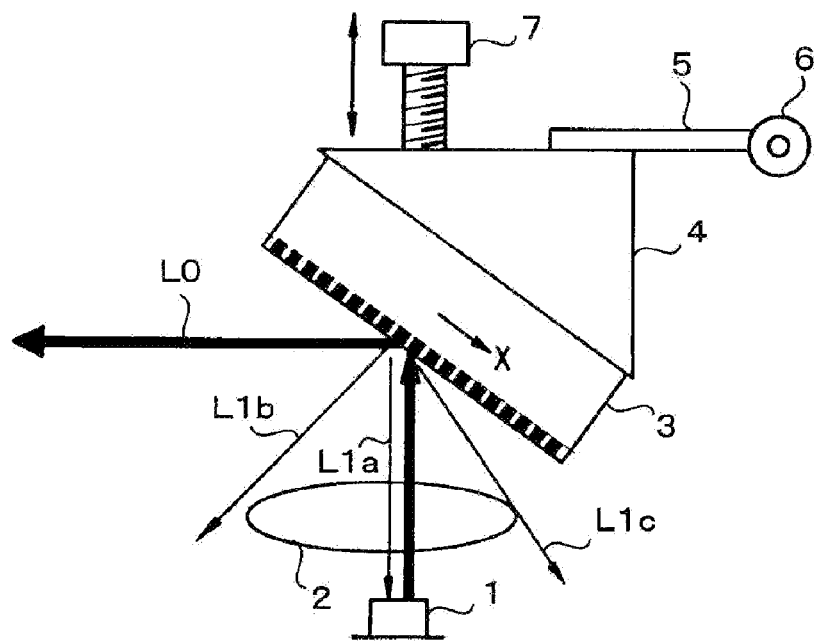
FIG. 1 is a schematic diagram showing a structure or a Littrow type laser.
Figure 2:
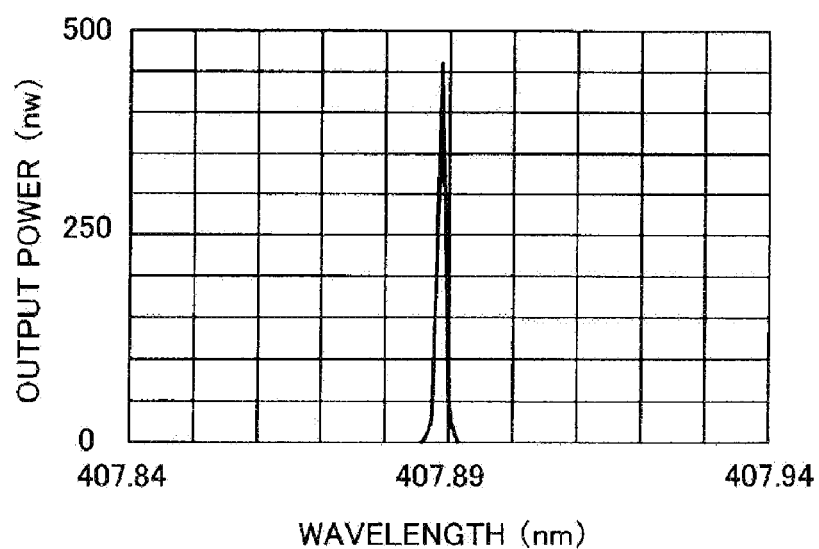
FIG. 2 is a graph showing a spectrum of laser light emitted from an external cavity type semiconductor laser.
Figure 3:
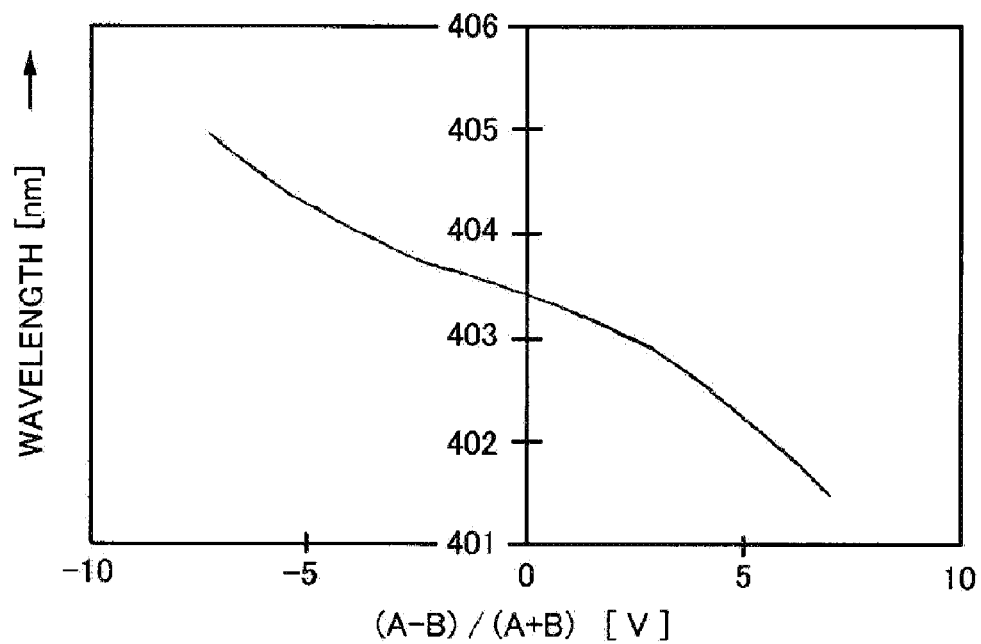
FIG. 3 is a graph showing an example of variation of a wavelength of a tunable laser.
Figure 4:
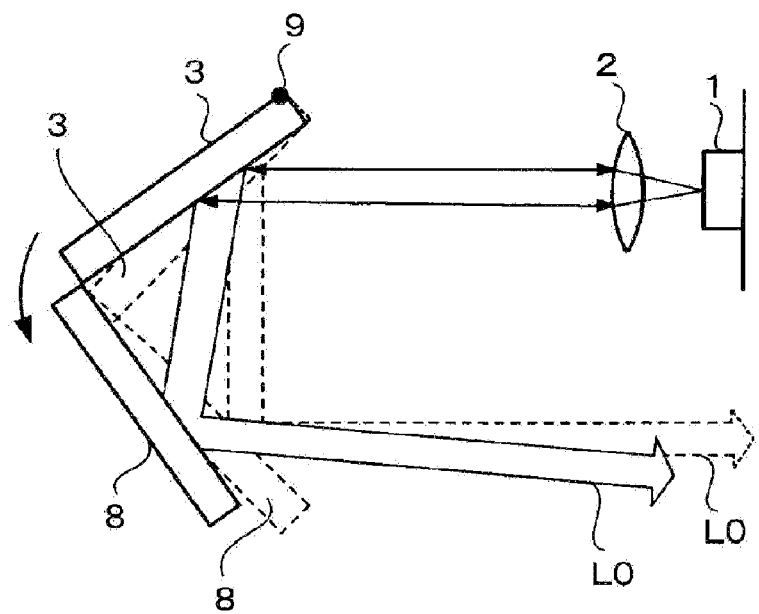
FIG. 4 is a schematic diagram showing a structure of a Littrow type laser having a structure of a mirror set.
Figure 5:
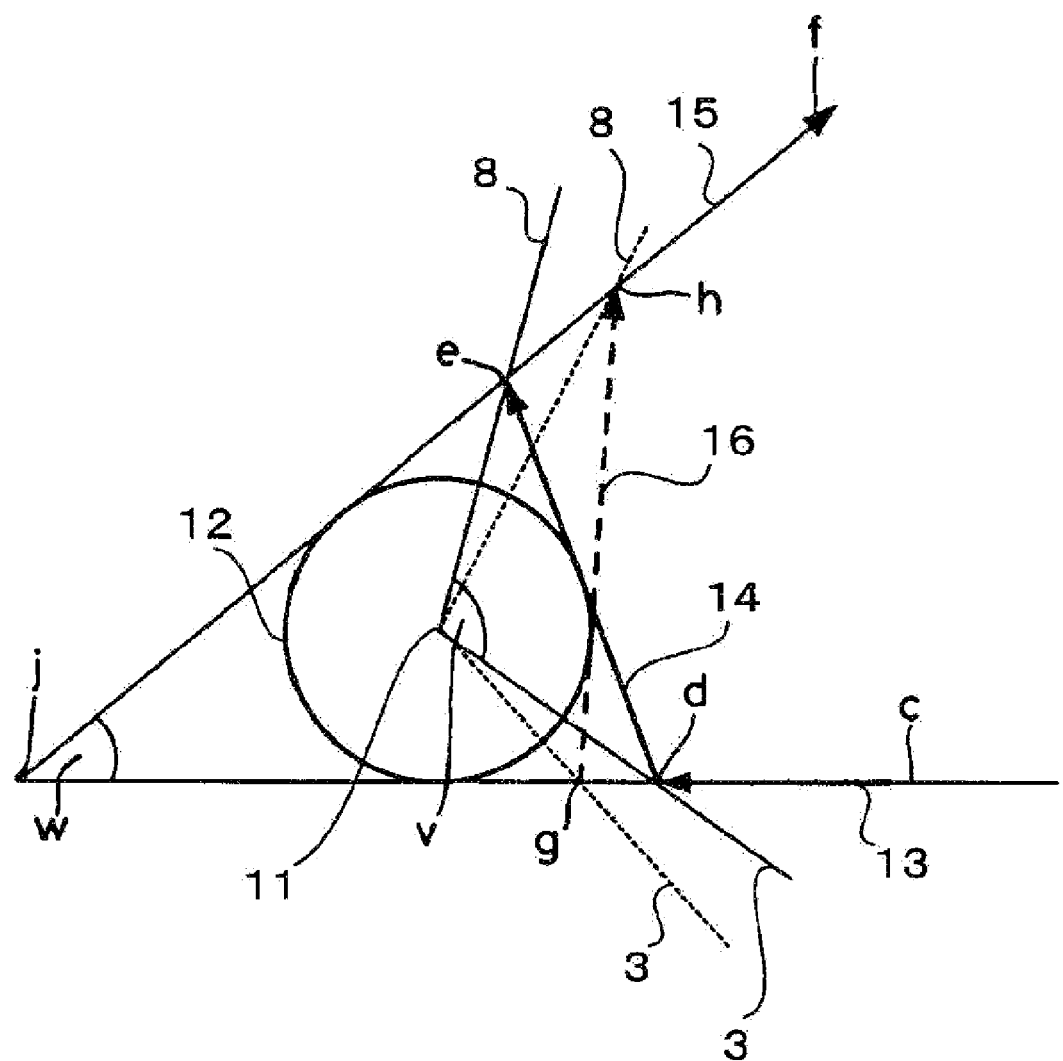
FIG. 5 is a schematic diagram describing that the direction of exit laser light does not vary in the mirror set structure Littrow type laser.

As was described with reference to FIG. 5, with a fulcrum O of an intersection of an extended line of a reflection surface of the grating 3 and an extended line of a reflection surface of the semi-transmissive mirror 32, by rotating the grating 3 and the semi-transmissive mirror 32 while the open angle is kept, the direction of the emitted laser light becomes constant. More specifically, a mirror holder 34 that holds the grating 3 and the semi-transmissive mirror 32 and that is rotated around the fulcrum is disposed. The mirror holder 34 has a square prism shape fitted to a rotation shaft 35.

The grating 3 generates first order light in a direction that vary corresponding to the wavelength. The angle of the grating 3 is set so that first order light corresponding to a predetermined wavelength for example 410 nm is returned to the laser diode 1. As a result, the component of the predetermined wavelength becomes large in the laser diode 1. As a result, the laser diode 1 emits single mode light. Most of laser light that the laser diode 1 emits is zero-th order light rather than the first order light. Thus, the external cavity type semiconductor laser named the Littrow type can vary an oscillation wavelength by changing the angle of the grating 3.

The semi-transmissive mirror 32 reflects the zero order light reflected by the grating 3 in a predetermined direction. However, the semi-transmissive mirror 32 does not fully reflect the zero order light, but transmits a part of the zero-th order light. The two-divided detector 33 is disposed so that it is radiated with light transmitted through the semi-transmissive mirror 32. The two-divided detector 33 has two light detectors aligned perpendicular to the moving directions of a spot that is generated by the grating 3 and the semi-transmissive mirror 32 that are rotated. At a predetermined position, the spot is equally placed on the two detectors. As the spot moves, output signals of the detectors vary.

The direction of laser light that is reflected by the grating 3 and entered into the semi-transmissive mirror 32 is varied corresponding to the angle of the grating 3. As a result, when the angle of the grating 3 is changed, the incident position of light to the two-divided detector 33 is varied as denoted by an arrow mark. When this variation is detected, the wavelength of the laser light can be detected.

In other words, when optical currents A and B detected by the two detectors of the two-divided detector 33 are calculated according to the following formula, the position can be detected.

Position (wavelength)=$(A-B)/(A+B)$

Light amount=$A+B$

The detection device is not limited to the two-divided detector 33. Instead, the detection device may be a one-dimensional position sensitive detector (PSD). The PSD has a structure of which a resistor layer is equally formed on one or both surfaces of a high resistance semiconductor substrate and a pair of signal output electrodes are formed at both ends of the resistor layer. The light reception surface also has a PN junction along with the resistor layer. A optical current is generated on the light reception surface by the photovoltatic effect. Optical currents A and B are generated at the electrodes formed at the both ends of the resistor layer corresponding to the position of the light spot on the light reception surface. When the light spot is positioned at the center of the light reception surface, the optical current A is equal to the optical current B.

Thus, the position of the light spot on the light reception surface varies as the wavelength varies. The variation of the position can be detected by the following formula:

Position(wavelength)=$(A-B)/(A+B)$

As a result, the wavelength of the laser light can be determined.

Since the wavelength of the laser light can be detected with the detection signals of the two-divided detector 33, the wavelength of the laser light that is being generated can be monitored. The inclination of the grating 3 is controlled so that a desired wavelength is obtained.

As a linear drive source that changes the inclination of the grating 3, the piezo legs motor 20 is used. The piezo legs motor 20 has a structure described with reference to FIG. 7A to FIG. 7D. A sphere member 37 is secured to an edge of a rod 36. The rod 36 is disposed on one end of the mirror holder 34. The grating 3 and the semi-transmissive mirror 32 are disposed on the other end of the mirror holder 34. The sphere member 37 is fitted to a ring hinge 38 that is a reception portion.

The other end of the ring hinge 38 is secured to the drive rod 23 that is a moving member of the piezo legs motor 20. As the piezo legs motor 20 is driven, the drive rod 23 is moved as denoted by arrow marks. When the drive rod 23 is moved, the mirror holder 34 is rotated through the ring hinge 38 and the sphere member 37. As a result, the grating 3 and the semi-transmissive mirror 32 are rotated. Thus, the wavelength of the emitted laser light is varied.

Figure 9:
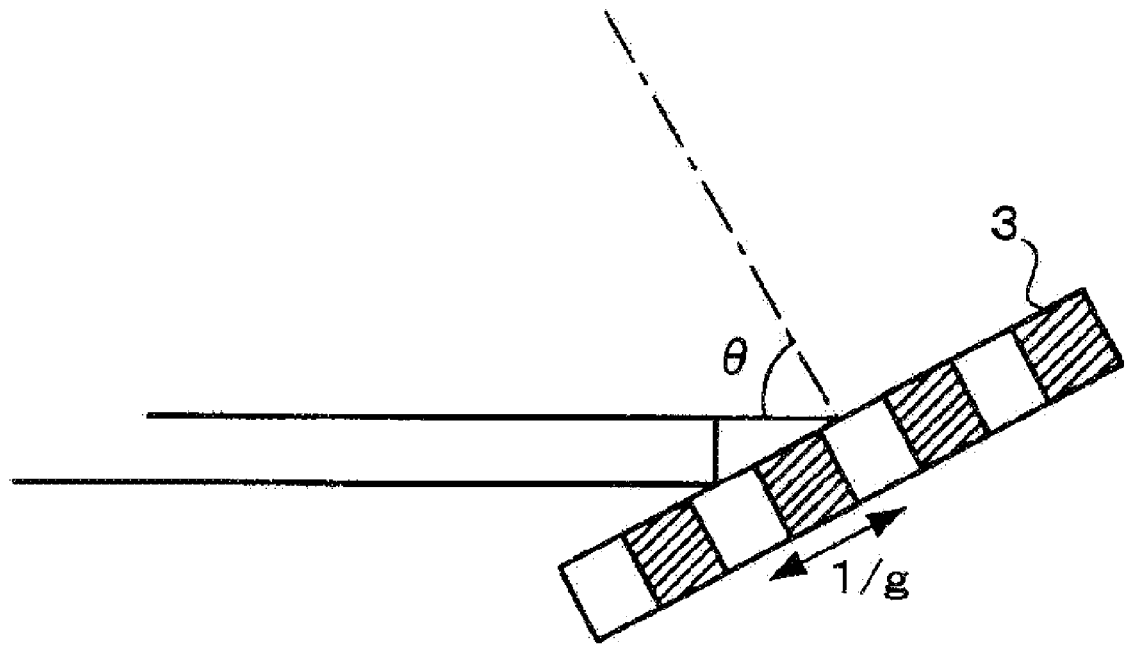
FIG. 9 is a schematic diagram describing variation of a wavelength corresponding to inclination of a grating.

FIG. 9 shows the grating 3. Assuming that the incident angle to the grating 3, namely the first order diffraction angle, is denoted by θ and the number of grooves per unit length is denoted by g, the wavelength λ can be expressed by the following formula.

$$\lambda = 2(\sin\theta)/g \quad (1)$$

FIG. 9 shows two laser beams. Since the Littrow structure is used, the incident angle is equal to the diffraction angle. In formula (1), (sin θ)/g denotes a one-way optical path difference and coefficient 2 denotes two ways.

Figure 10:
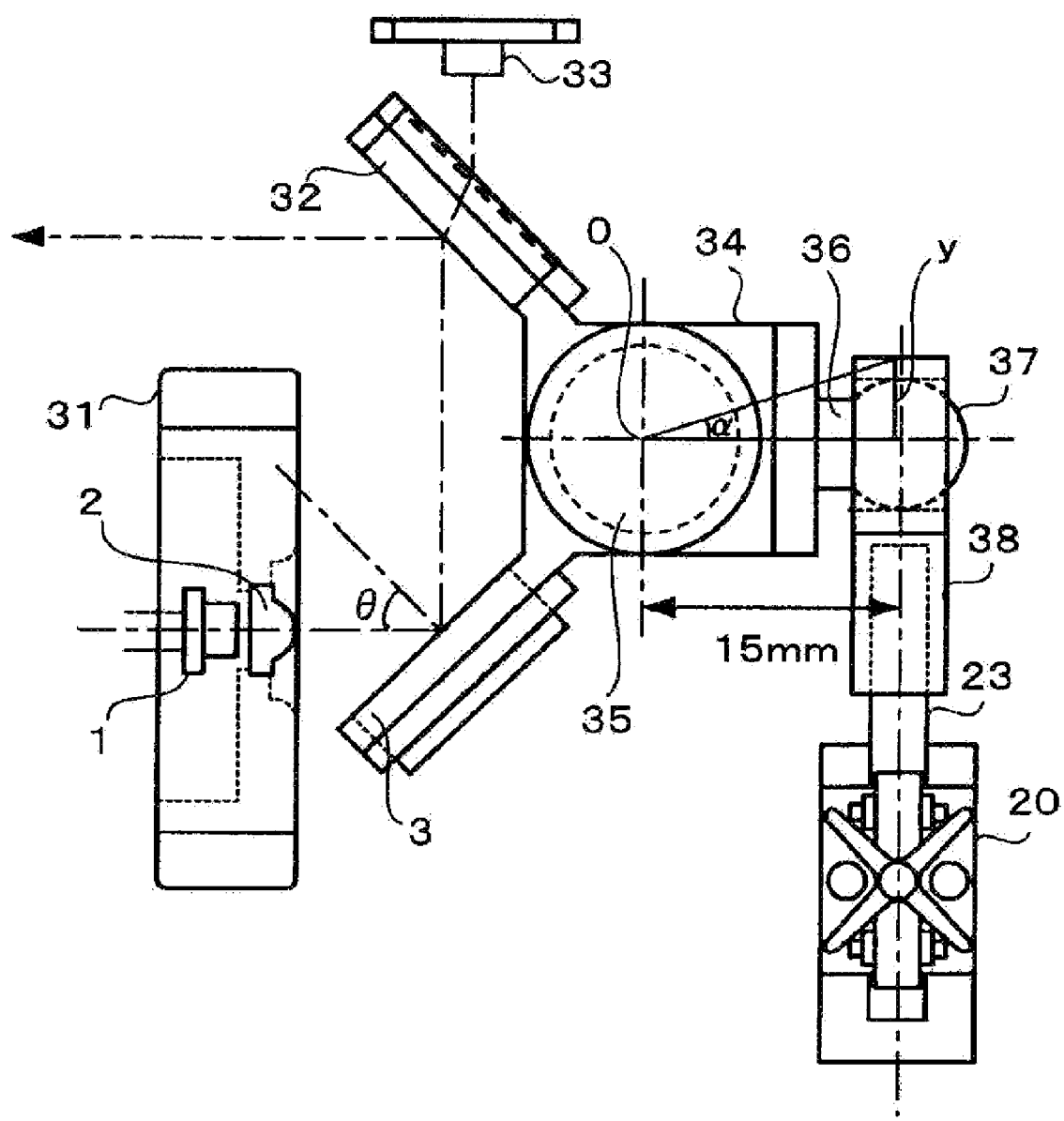
FIG. 10 is a plan view describing the variation of the wavelength corresponding to the inclination of the grating according to the first embodiment of the present invention.

FIG. 10 shows a state of which the distance between the fulcrum O of the rotation of the mirror holder 34 and the center of the sphere member 37 (the center of the drive rod 23) is 15 mm (=15000 μm) in the structure shown in FIG. 8. It is assumed that the moving amount of the center of the sphere member 37 is denoted by y [μm] and that when y=0, the angle of the fulcrum O and the center of the sphere member 37 is denoted by α.

It is assumed that when the wavelength is 406 nm, y=0. At this point, since θ=46.95°, the following formula (2) is satisfied.

$$\theta = 46.95° - \alpha \quad (2)$$

For example, when α=0°, θ=46.95°; when α=46.95°, θ=0°.

The relationship between the angle θ and the moving amount y is given by the following formula (3).

$$\tan(\alpha) = y/15000 \quad (3)$$

With formulas (1), (2), and (3), the wavelength λ can be obtained as a function of the angle θ and the moving amount y.

$$\lambda = 2\sin\{46.95° - \arctan(y/15000)\}/g \quad (4)$$

When y=80 µm, the wavelength y is 408 nm. Thus, when the moving distance y is changed from 0 to 80 µm, the wavelength can be varied from 406 nm to 408 nm.

The minimum length of one step of the piezo legs motor 20 is 2 nm. In the example shown in FIG. 10, the angle θ can be changed at a step of $(8 \times 10^{-6})°$. Specifically, the step of the wavelength necessary for a hologram device is around 100 pm, which corresponds to an angle of 0.015° to be changed. As a result, it is necessary to change the angle θ at a step of smaller than 0.015°. For example, when one step is 250 nm, the angle θ can be changed at a step of 0.001°. The moving amount y can be controlled at a step amount of the piezo legs motor 20. The movement of the drive rod 23 of the piezo legs motor 20 may be measured by a distortion gauge.

As described above, to change the wavelength for 2 nm, the moving distance y is 80 µm. To change the wavelength for 6 nm, the moving distance y is 240 µm (=0.24 mm). The piezo legs motor 20 can be driven until the drive rod 23 is almost removed from the main body. Specifically, the moving distance y that can be obtained is 10 mm or more.

Next, with reference to FIG. 11, an operation that controls the piezo legs motor 20 corresponding to the monitored result of the wavelength of the two-divided detector 33 will be described. At step S1, a shutter is closed. The shutter prevents laser light from being emitted to the outside while the wavelength of the laser light is being adjusted. The shutter controls the emission of light reflected by the semi-transmissive mirror 32.

At step S2, an addition signal and a difference signal of the two-divided detector 33 are obtained. The difference signal is normalized by the addition signal. At step S3, with reference to a pre-provided table, a wavelength is detected from the difference signal. At step S4, it is determined whether the detected wavelength is equal to a designated wavelength.

When the determined result at step S4 denotes that the detected wavelength is not equal to the designated wavelength, the flow advances to step S5. At step S5, the piezo legs motor 20 is driven in the direction so that the detected wavelength becomes close to the designated wavelength. In this case, the number of drive steps corresponding to the difference between the designated wavelength and the detected wavelength is set. Thereafter, the flow returns to step S2 (calculation for the difference signal).

When the determined result at step S4 denotes that the detected wavelength is equal to the designated wavelength, the flow advances to step S6. At step S6, the piezo legs motor 20 is stopped. Thereafter, the flow advances to step S7. At step S7, the shutter is opened. Laser light emitted through the shutter is used for an application, for example a hologram device.

In the piezo legs motor 20, even if its drive power supply is turned off, the position of the drive rod 23 does not vary. Thus, after the power supply is turned off and then turned on, the laser emits light having a wavelength that is the same as the wavelength of light that the laser emitted before the power supply was turned off. Thus, when the former wavelength is used, after the power is turned on, the laser light can be used without necessity for performing the control as shown in FIG. 11. However, when the process that adjusts the wavelength in the case that the shutter is closed is typically performed as shown in FIG. 11, the software program can be simplified.

Next, other embodiments of the tunable laser apparatus that uses a piezo legs motor 20 as a drive source will be described. In drawings referenced in the following description, for simplicity, a two-divided detector 33 that light transmitted through a semi-transmissive mirror 32 enters is omitted.

FIG. 12A and FIG. 12B show a second embodiment of the present invention. Like the structure shown in FIG. 8A and FIG. 8B, a sphere member 37 is secured to an edge of a rod 36 that protrudes from a mirror holder 34. The sphere member 37 is fitted to a ring hinge 39. The ring hinge 39 is secured to a drive rod 23 of a piezo legs motor 20. When the piezo legs motor 20 is driven, the drive rod 23 is moved as denoted by arrow marks. When the drive rod 23 is moved, the mirror holder 34 is rotated through the ring hinge 39 and the sphere member 37. As a result, a grating 3 and a semi-transmissive mirror 32 are rotated. Thus, the wavelength of the laser light that is emitted is varied.

As shown in FIG. 12B, the ring hinge 39 has an elliptical opening in which there are an upper gap and a lower gap to the sphere member 37. With the gaps, even if upper and lower mechanical positions are not perfectly adjusted, the sphere member 37 and the ring hinge 39 can be prevented from being engaged. As a result, the mirror holder 34 can be smoothly rotated.

Figure 13B:
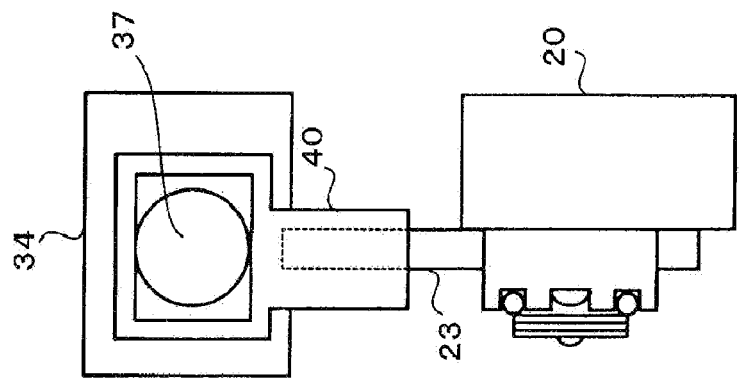
FIG. 13A and FIG. 13B are a plan view and a side view of a third embodiment of the present invention, respectively.
Figure 13A:
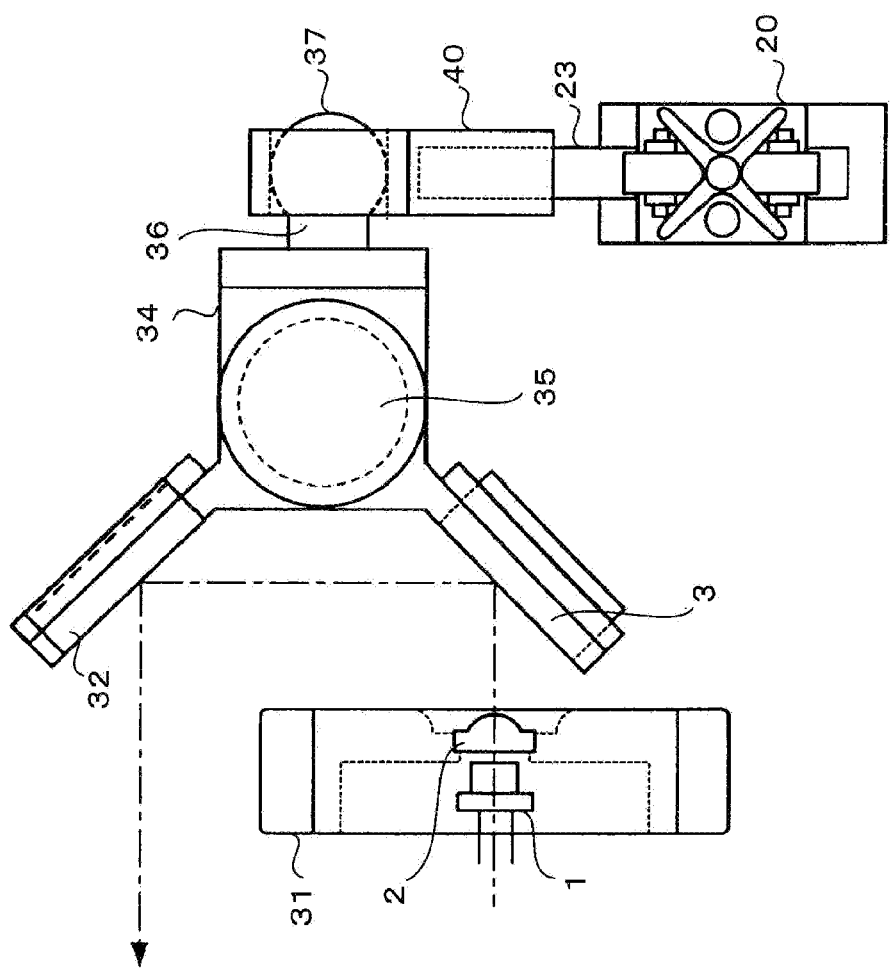

FIG. 13A and FIG. 13B show a third embodiment of the present invention. A sphere member 37 is secured to an edge of a rod 36 that protrudes from a mirror holder 34. The sphere member 37 is fitted to a ring hinge 40. The ring hinge 40 is secured to a drive rod 23 of a piezo legs motor 20. As shown in FIG. 13B, the ring hinge 40 has an angular opening in which there are an upper gap and a lower gap to the sphere member 37. With the gaps, even if upper and lower mechanical positions are not perfectly adjusted, the sphere member 37 and the ring hinge 40 can be prevented from being engaged. As a result, the mirror holder 34 can be smoothly rotated.

FIG. 14A and FIG. 14B show a fourth embodiment of the present invention. A sphere member 37 is secured to an edge of a rod 36 that protrudes from a mirror holder 34. The sphere member 37 is fitted to a bracket shaped hinge 41. The sphere member 37 is inserted into an opening of the bracket shaped hinge 41. As a result, the bracket shaped hinge 41 holds the sphere member 37 from both the sides and the rear surface.

Figure 15:
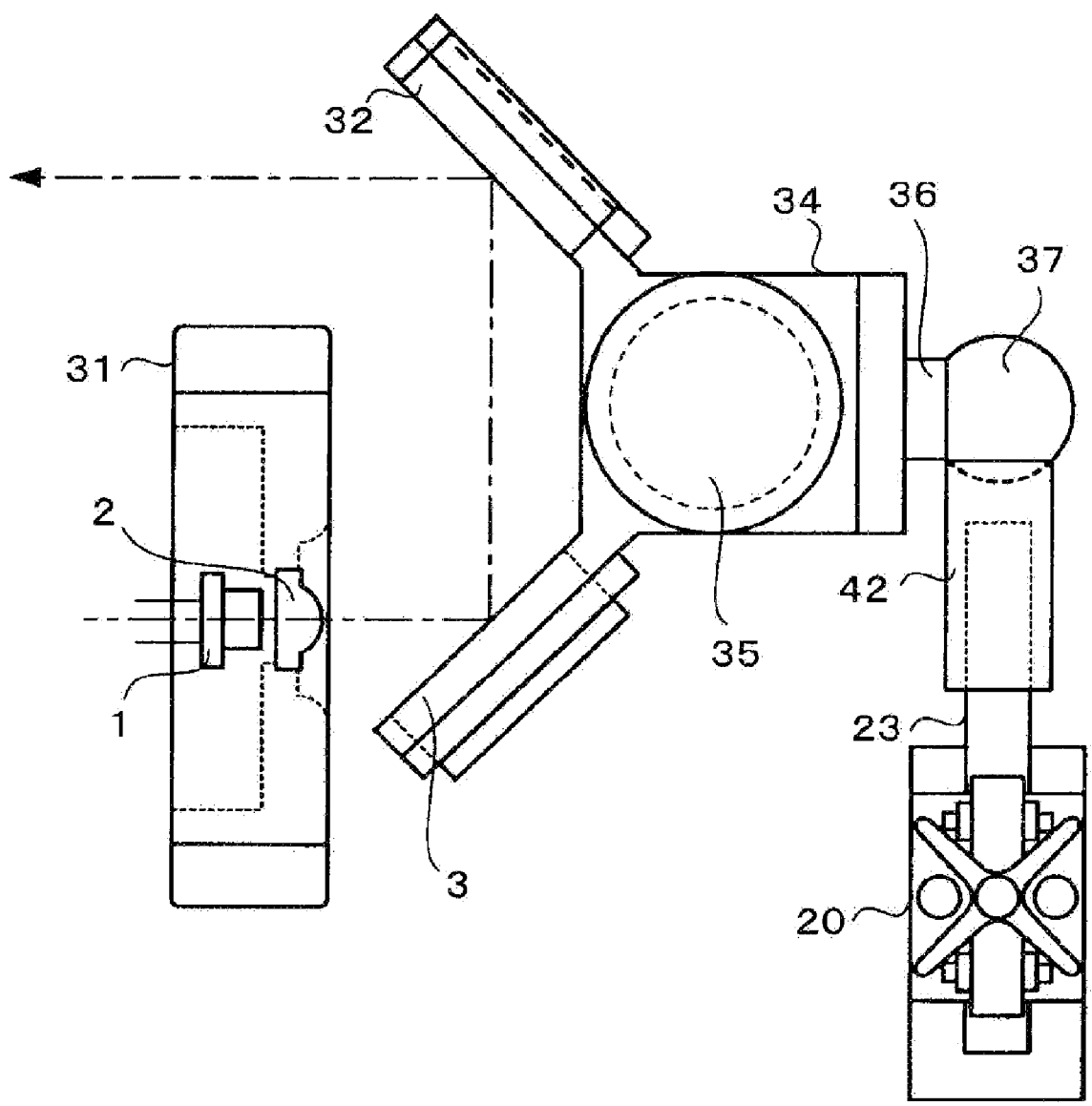
FIG. 15 is a plan view of a fifth embodiment of the present invention.

Next, with reference to FIG. 15, a fifth embodiment of the present invention will be described. A sphere member 37 is secured to an edge of a rod 36 that protrudes from a mirror holder 34. The sphere member 37 is placed in a reception portion of a cylinder portion 42 of a magnet joint.

Figure 16:
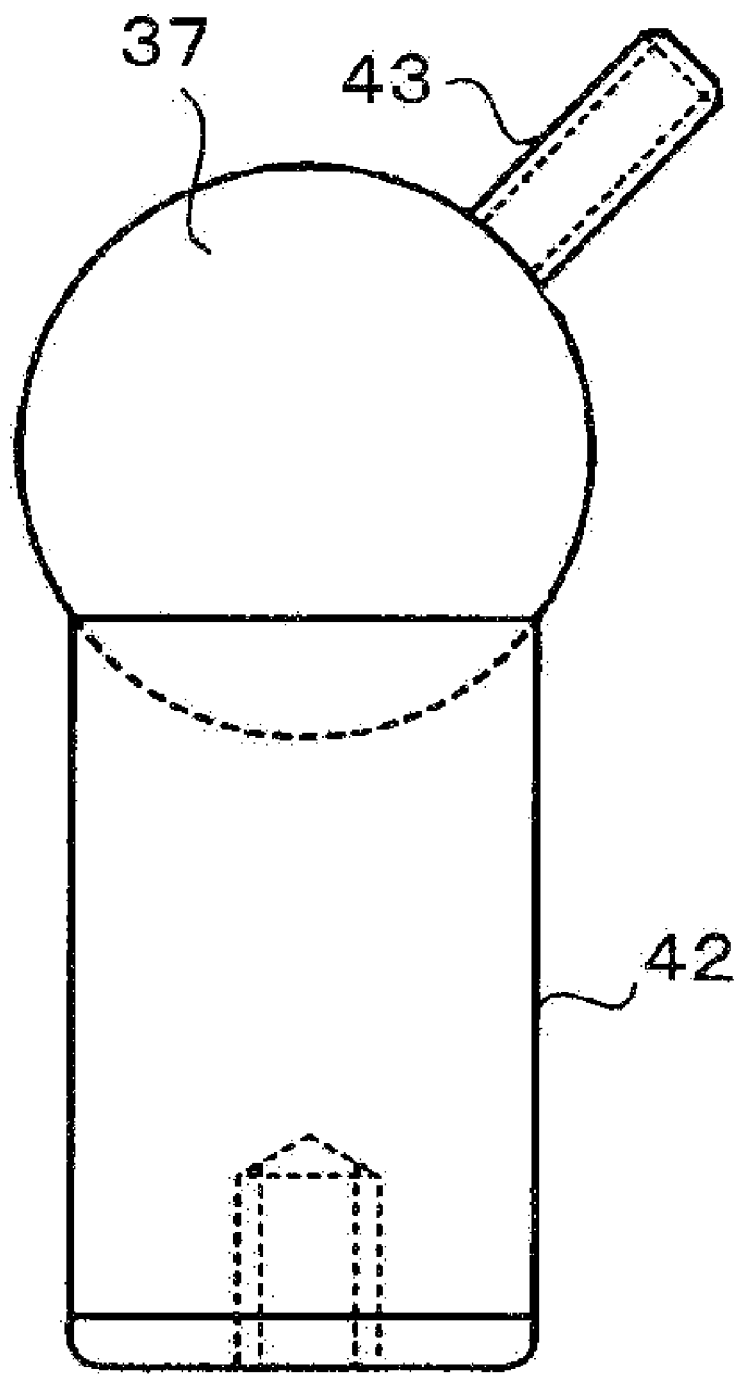
FIG. 16 is a plan view showing an example of a magnet joint used in the fifth embodiment of the present invention.

FIG. 16 is an enlarged view of the fifth embodiment. As shown in FIG. 16, a magnet and a yoke are disposed in the cylinder portion 42. The sphere member 37 made of for example steel is attracted by only magnetic force. A screw 43 is disposed on the sphere member 37. The screw 43 is used to connect the rod 36 and the sphere member 37. Since the sphere member 37 is attracted by magnetic force, the mirror holder 34 can be rotated without play.

FIG. 17A and FIG. 17B show a sixth embodiment of the present invention. A magnet 44 is mounted on a mirror holder 34. Another magnet 45 that is magnetically connected to the magnet 44 is mounted on a drive rod 23. An attractive surface of the magnet 44 forms a part of a cylinder surface. Since the mirror holder 34 is magnetically attracted, it can be rotated without play.

Figure 18B:
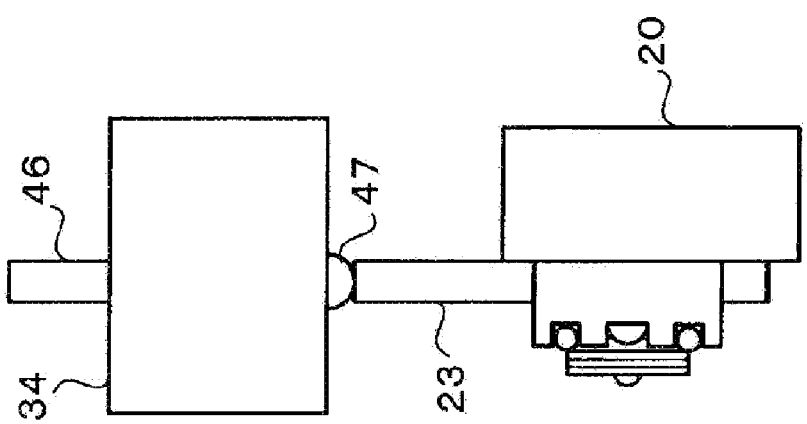
FIG. 18A and FIG. 18B are a plan view and a side view of a seventh embodiment of the present invention, respectively.
Figure 18A:
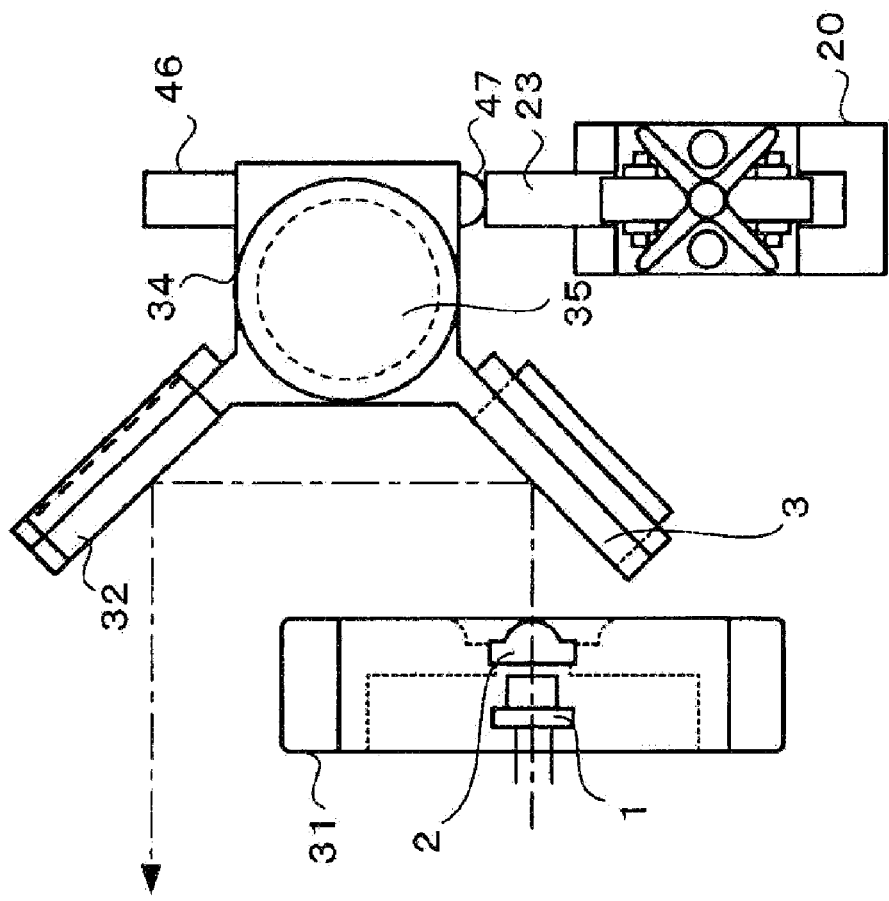

FIG. 18A and FIG. 18B show a seventh embodiment of the present invention. A mirror holder 34 is pressed in one direction (the lower direction in FIG. 18) by a spring 46. An edge of a drive rod 23 of a piezo legs motor 20 contacts a semi-sphere contact portion 47 disposed on the mirror holder 34. When the drive rod 23 is slid, the mirror holder 34 is rotated.

Figure 19:
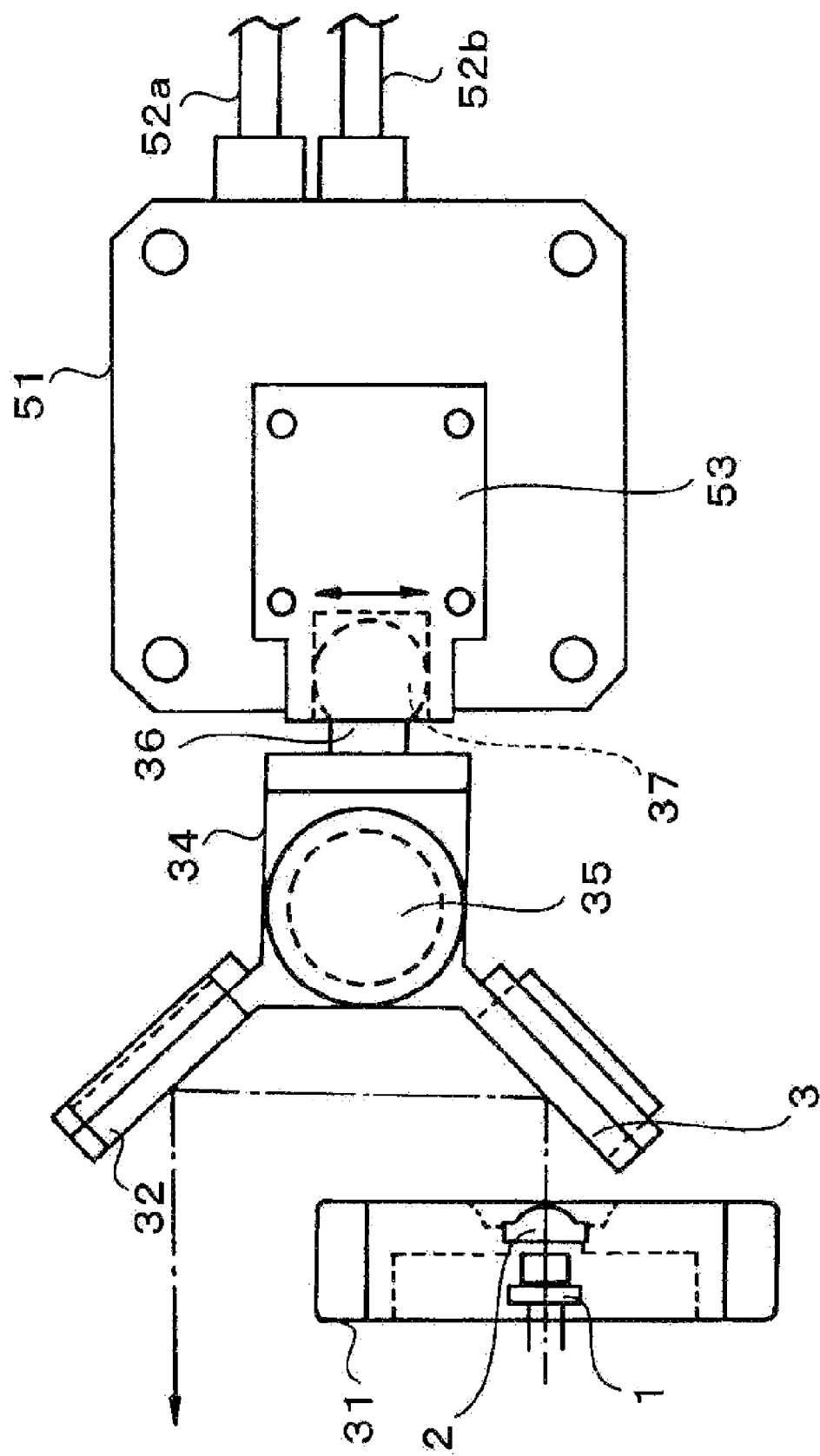
FIG. 19 is a plan view of an eighth embodiment of the present invention.

FIG. 19 shows an eighth embodiment of the present invention. In the eighth embodiment, a piezo actuator 51 is used instead of a piezo legs motor. The piezo actuator 51 has a box shape. The piezo actuator 51 contains a piezoelectric device. A drive voltage is supplied to the piezo actuator 51 through cables 52*a* and 52*b*. When the drive voltage is applied to the piezo actuator 51, the piezoelectric device expands and shrinks. When the piezoelectric device expands and shrinks, a moving plate 53 is moved as denoted by arrow marks.

A bracket shaped concave portion is formed at a part of the moving plate 53. A sphere member 37 secured at an edge of a rod 36 that protrudes from the mirror holder 34 is fitted to the inside of the concave portion. Thus, when the piezo actuator 51 is driven, a grating 3 and a semi-transmissive mirror 32 can be rotated.

Since the amount for which the piezo actuator 51 expands is as small as several ten μm in comparison with that for a piezo legs motor 20, the variation range of the wavelength is as narrow as around ±1 nm. However, the seventh embodiment can be used for an application for which the variation range of the wavelength is small.

Figure 11:
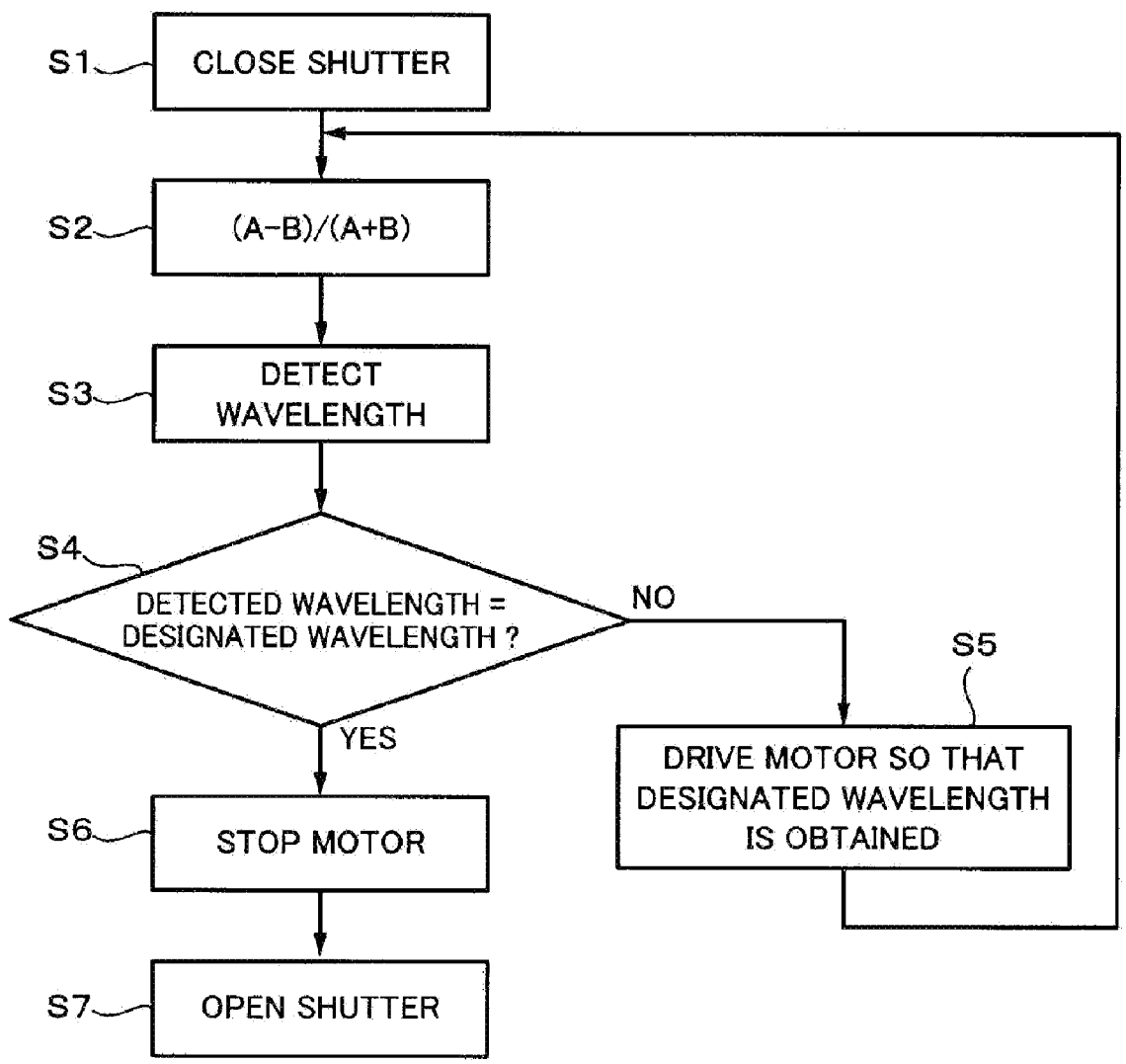
FIG. 11 is a flow chart showing an operation of a wavelength control according to the first embodiment of the present invention.

When the piezo actuator 51 is used, the control method of the flow chart shown in FIG. 11 can be used. When a mechanism that measures a moving amount with a distortion gauge is disposed, a two-divided detector can be omitted. In addition, the wavelength can be measured without necessity for emitting laser light. Thus, when the semiconductor laser is turned on and off, the same function as a shutter can be accomplished. As a result, the shutter can be omitted.

It should be understood by those skilled in the art that various modifications, combinations, sub-combinations and alternations may occur depending on design requirements and other factors insofar as they are within the scope of the appended claims or the equivalents thereof.

For example, according to an embodiment of the present invention, a grating may be disposed to detect a wavelength of laser light. The wavelength may be detected from the fact that the diffraction angle of first order light varies corresponding to the wavelength. In this case, a regular mirror is used instead of a semi-transmissive mirror. In addition, an embodiment of the present invention can be used for a laser light source for other than a hologram device.

What is claimed is:

1. A laser apparatus, comprising:
  a diffraction grating that receives laser light from a semiconductor laser, emits first order diffracted light having a predetermined wavelength to the semiconductor laser, and reflects zero-th order light;
  reflection means for reflecting the zero-th order light reflected by the diffraction grating;
  hold means for holding the diffraction grating and the reflection means while an open angle of the diffraction grating and the reflection means is kept constant, the hold means being rotatable with a fulcrum of an intersection of an extended line of a front surface of the diffraction grating and an extended line of a front surface of the reflection means;
  linear drive means for rotating the hold means with a linear motion of a piezoelectric device that expands and shrinks by the piezoelectric effect; and
  a connection portion that fits a sphere member that protrudes from the hold means and a reception portion disposed on a moving member that performs the linear motion of the linear drive means.

2. A drive method of varying an angle of a diffraction grating of a laser apparatus having a diffraction grating that receives laser light from a semiconductor laser, emits first order diffracted light having a predetermined wavelength to the semiconductor laser, and reflects zero-th order light, reflection means for reflecting the zero-th order light reflected by the diffraction grating, hold means for holding the diffraction grating and the reflection means while an open angle of the diffraction grating and the reflection means is kept constant, the hold means being rotatable with a fulcrum of an intersection of an extended line of a front surface of the diffraction grating and an extended line of a front surface of the reflection means, and linear drive means for rotating the hold means with a linear motion of a piezoelectric device that expands and shrinks by the piezoelectric effect, the drive method comprising the steps of:
  determining whether the wavelength detected by the detection means matches a designated wavelength;
  stopping the linear drive means when the determined result at the determination step denotes that the detected wavelength matches the designated wavelength; and
  driving the linear drive means so that the detected wavelength becomes close to the designated wavelength when the determined result at the determination step denotes that the detected wavelength does not match the designated wavelength.

* * * * *